United States Patent [19]
Lee et al.

[11] Patent Number: 5,637,425
[45] Date of Patent: Jun. 10, 1997

[54] METHOD FOR FABRICATING PHASE SHIFT MASK COMPRISING A POLYMETHYLMETHACRYLATE PHASE SHIFT FILM

[75] Inventors: Jun-Seok Lee, Seoul; Suk-Bin Han, Choongchungbook-Do, both of Rep. of Korea

[73] Assignee: LG Semicon Co., Ltd., Cheongju, Rep. of Korea

[21] Appl. No.: 576,938

[22] Filed: Dec. 22, 1995

[30] Foreign Application Priority Data

Jul. 31, 1995 [KR] Rep. of Korea .................. 23476/1995

[51] Int. Cl.$^6$ .................................................. G03F 9/00
[52] U.S. Cl. .............................. 430/5; 430/311; 430/313; 430/322
[58] Field of Search ........................ 430/5, 311, 313, 430/322

[56] References Cited

U.S. PATENT DOCUMENTS

| 5,194,346 | 3/1993 | Rolfson et al. | 430/5 |
| 5,322,749 | 6/1994 | Han | 430/5 |
| 5,358,808 | 10/1994 | Nitayama et al. | 430/5 |

OTHER PUBLICATIONS

Levenson et al., "Improving Resolution in Photolithography with a Phase–Shifting Mask", IEEE Transactions on Electron Devices, vol. ED–29, No. 12, Dec. 1982.

Polasko et al., "Deep UV Exposure of $Ag_2Se/GeSe_2$ Utilizing an Excimer Laser", IEEE Electron Device Letters, vol. EdL–5, No. 1, Jan. 1984.

Hanyu et al., "New Phase–Shifting mask with Highly Transparent $SiO_2$ Phase Shifters", SPIE vol. 1264 Optical/Laser Microlithography III (1990).

Yoshikawa et al., "A New Inorganic Electron Resist of High Contrast", Applied Physics Letters, vol. 31, No. 3, 1 Aug. 1977.

*Primary Examiner*—S. Rosasco
*Attorney, Agent, or Firm*—Fleshner & Kim

[57] ABSTRACT

A method for fabricating a highly reliable phase shift mask, comprising the steps of: forming a phase shifting film and a screen on a transparent substrate, in sequence; forming an impurity layer on the screen; diffusing the impurities of the impurity layer selectively into the screen; removing the regions of the screen which are free of impurities; and selectively removing the phase shifting film. By virtue of using inorganic resist for screen, the method can be executed at low temperatures and a distortion of mask substrate can be prevented. Next, the vertical side wall of the shifter can be accomplished with ease owing to the high etch selectivity of the screen. In addition, the shifter beneath the screen offsets the bad affect resulting from the topology of the shifter, improving the effect of phase shift.

34 Claims, 8 Drawing Sheets

E. BEAM RADIATION

METHOD FOR FABRICATING PHASE SHIFT MASK COMPRISING A POLYMETHYLMETHACRYLATE PHASE SHIFT FILM

BACKGROUND OF THE INVENTION

1. Field of the Invention

The present invention relates, in general, to a method for fabricating a phase shift mask (hereinafter referred to as "PSM") and, more particularly, to taking advantage of inorganic resist, designed to be useful for alternate types, having superior light-screening effect.

2. Description of the Prior Art

The Most widely used phase shift masks have been based on the alternate type PSM. In such PSM the chrome screen pattern basically alternates with the shifter material.

In order to better understand the background of the invention, a description will be given of conventional representative methods for fabricating alternate type PSM, in conjunction with some drawings.

First, referring to FIG. 1, one conventional method for fabricating an alternate type PSM is shown.

As shown in FIG. 1 A, a chrome screen is formed on a mask substrate 1 and then, etched into screen patterns 4 which are each spaced apart. On the resulting substrate 1 a blanket of resist 2 is deposited which is then locally opened to selectively expose a region on which a shifter will be formed. Thereafter, an oxide film 3 for shifter, for example, SiO₂ film is deposited entirely over the patterns.

As shown in FIG. 1B, all the oxide film 3 and the resist 2 but shifter pattern 3' are removed by a lift-off method, to complete the fabricating process of phase shift mask.

This method has a disadvantage that, when carrying out the lift-off process, particles may remain on the substrate, leading to contamination. In addition, uniform phase-shifting effect on the substrate cannot be accomplished owing to the topology of the shifter.

Referring to FIG. 2, there is shown another conventional method for fabricating an alternate type PSM.

First, as shown in FIG. 2A, a chrome screen is deposited on a mask substrate 1 and then, etched into screen patterns 4 which each are regularly spaced apart. A blanket of polymethylmethacrylate (hereinafter referred to as "PMMA") 5, an organic polymer, is deposited over the substrate and then, selectively exposed to E. beam as indicated by the arrow.

FIG. 2B shows the completion of phase shift mask. For this, the exposed PMMA is etched to form a shifter pattern 5' as shown in FIG. 2B.

Like the conventional method previously mentioned, this method cannot bring about a complete shifter effect owing to the topology of the chrome.

Besides, the above-mentioned conventional methods both have a significant disadvantage of occurrence of mask distortion resulting from stress on the substrate which is attributed to a thermal treatment according to the chrome deposition necessary for the screen or shifter.

SUMMARY OF THE INVENTION

Therefore, it is an object of the present invention to overcome the above problems encountered in prior arts and to provide a method for fabricating a phase shift mask superior in phase shift effect.

It is another object of the present invention to provide a method for fabricating a phase shift mask by which distortion of a mask substrate can be prevented.

In accordance with an aspect of the present invention, there is provided a method for fabricating a phase shift mask, comprising the steps of: forming a phase shifting film and a screen on a transparent substrate, in sequence; forming an impurity layer on the screen; diffusing the impurities of the impurity layer selectively into the screen; removing the regions of the screen which are free of impurities; and selectively removing the phase shifting film.

In accordance with another aspect of the present invention, there is provided a method for fabricating a phase shift mask, comprising the steps of: forming a phase shifting film, a screen and an impurity layer on a transparent substrate, in sequence; diffusing the impurities of the impurity layer selectively into the screen; removing the regions of the screen which are free of impurities; selectively forming silylation layers on the surface of the phase shifting film; and etching the phase shifting film with the silylation layers serving as a mask.

BRIEF DESCRIPTION OF THE DRAWINGS

The above objects and other advantages of the present invention will become more apparent by describing in detail the preferred embodiments of the present invention with reference to the attached drawings in which:

FIG. 4 shows the property of a phase shift mask of the present invention upon illuminating a beam;

DETAILED DESCRIPTION OF PREFERRED EMBODIMENTS

Figure 1A:
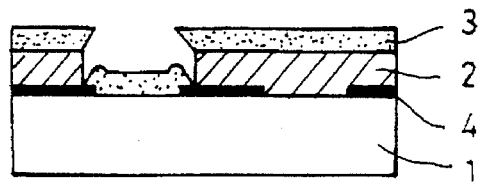
FIGS. 1A and 1B are schematic cross sectional views showing stepwise one representative conventional method for fabricating a phase shift mask.
Figure 1B:
Figure 2A:
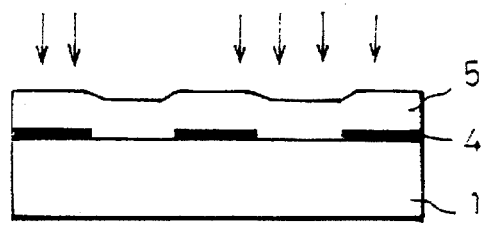
FIGS. 2A and 2B are schematic cross sectional views showing stepwise another representative conventional method for fabricating a phase shift mask.
Figure 2B:
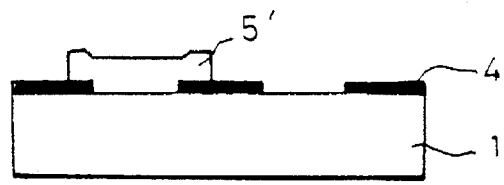

The present invention relates to a phase shift mask employing an inorganic resist as a screen. In this regard, the inorganic resist has an empirical formula $Ge_xSe_{1-x}$ (x=0.10–0.33), showing the property that diffusion of silver reduces transmittance.

The application of the preferred embodiments of the present invention is best understood with reference to the accompanying drawings, wherein like reference numerals are used for like and corresponding pans, respectively.

Referring to FIG. 3, there is illustrated a method for accomplishing a PSM by using the inorganic resist, according to a first embodiment.

Figure 3A:
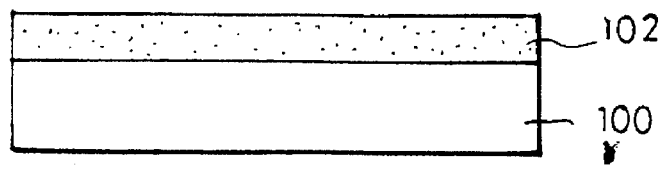
FIGS. 3A through 3G are schematic cross sectional views showing a method for fabricating a phase shift mask, according to a first embodiment of the present invention.

First, an organic polymer 102 as a phase shifter film, for example, PMMA film is deposited over a transparent substrate 100 serving as mask substrate, as shown in FIG. 3A.

Figure 3B:
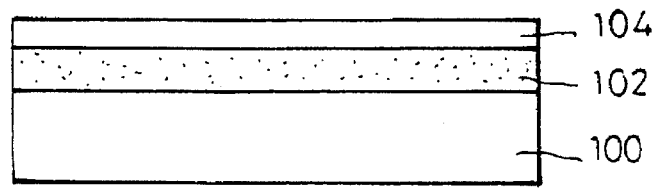

FIG. 3B is a cross section after an inorganic resist screen 104 consisting of $Ge_{10}Se_{90}$ (germanium selenide) is formed at a thickness of about 1,000 to 4,000 Angstrom on the organic polymer 102 by PECVD sputtering method. The resist screen 104 preferably ranges in thickness from about 2,000 to 3,500 Angstrom and more preferably about 2,500 Angstrom.

Figure 3C:
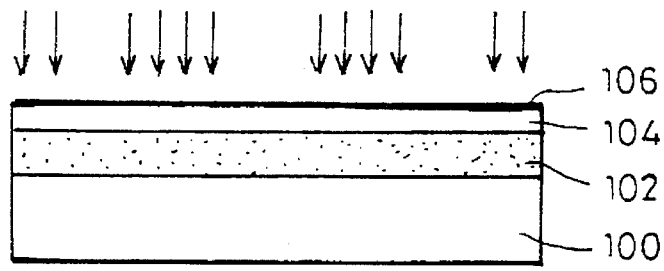

FIG. 3C is a cross section after the inorganic resist 104 is surface-treated with an aqueous $AgNO_3$, to form a silver-containing film 106 about 100 Angstrom thick, followed by selective exposure of it to E. beam. It is allowed that the silver-containing film 106 is formed at a thicknesses ranging from about 50 to 300 Angstrom.

Figure 3D:
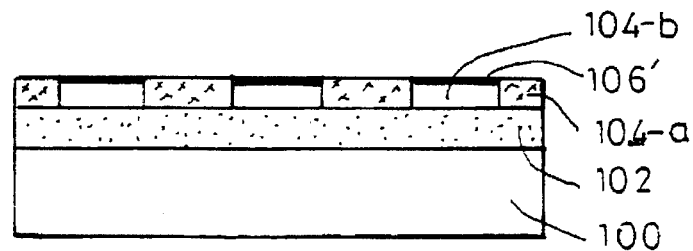

As a result, the exposed portions of silver-containing film 106 are diffused into the inorganic resist 104, to form silver-doped inorganic resist 104-a, as shown in FIG. 3D.

Figure 3E:
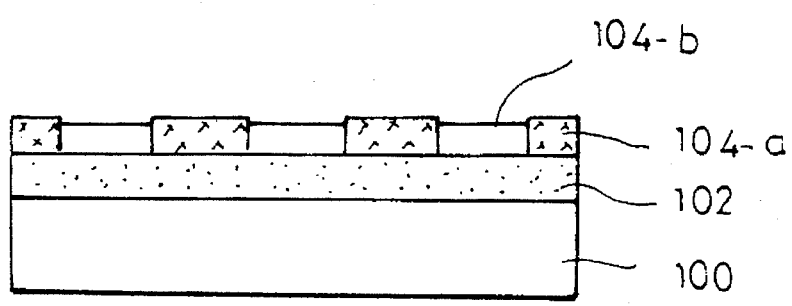

FIG. 3E is a cross section after the remaining silver-containing film portions 106' are removed with an $HNO_3$-$HCl$-$H_2O$ solution.

Figure 3F:
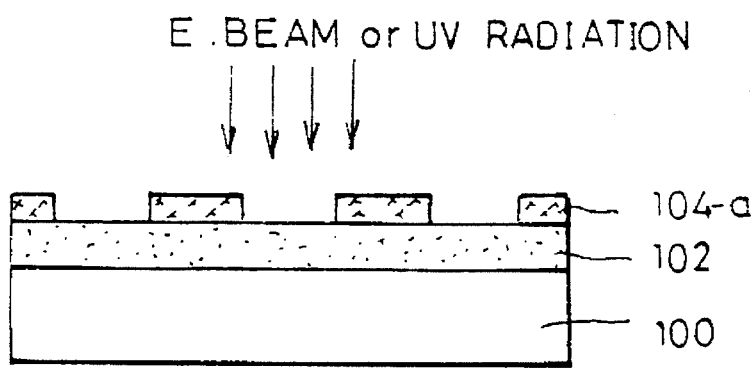

FIG. 3F is a cross section after the elimination of the inorganic resist 104-b is done through a wet development process using $(CH_3)_2NH$, an alkaline developing solution, or through dry development process using $CF_4$, $CHF_3$ or $SF_6$, followed by the selective illumination of E. beam or uv light on the organic polymer 102. This selective radiation removes the exposed regions of the organic polymer 102, allowing predetermined surfaces of the substrate 100 to be exposed.

Figure 3G:
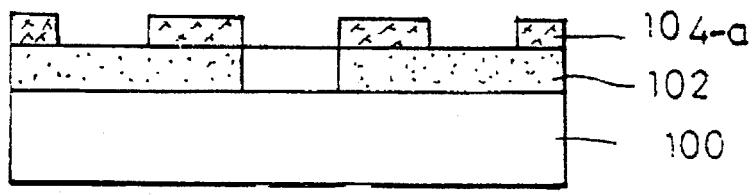

FIG. 3G shows a schematic cross section of the PSM which is fabricated by the above procedures. As shown in this figure, the PSM according to the first embodiment of the present invention comprises a plurality of regularly spaced-apart screens, each consisting of silver-doped inorganic resist 104-a, on a shifter of organic polymer 102 atop the substrate 100.

In order for the beam passing through the substrate to shift its phase, the organic polymer 102 must have a thickness that satisfies the following formula:

$$T=\lambda/2(n-1)$$

wherein $\lambda$ is the wavelength of an radiation beam and n represents refractive index of the shifter.

Figure 4A:
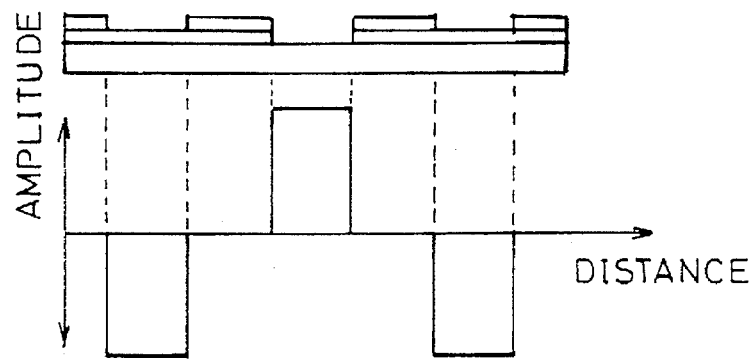
FIG. 4A is a graph showing the amplitude property of a beam passing out of the bottom of the phase shift mask.
Figure 4B:
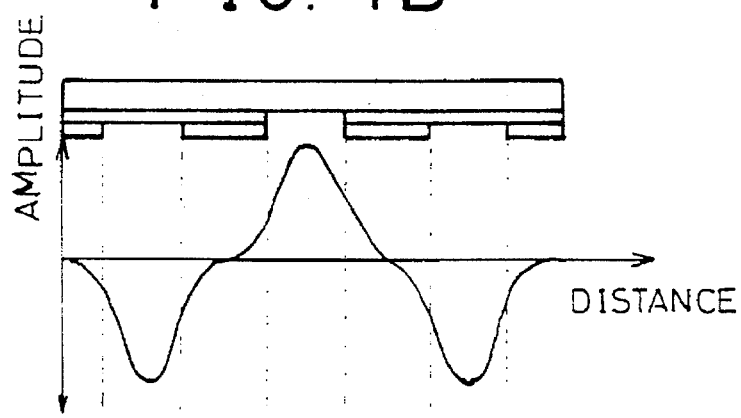
FIG. 4B is a graph showing the amplitude property of a beam passing out of the top of the phase shift mask.
Figure 4C:
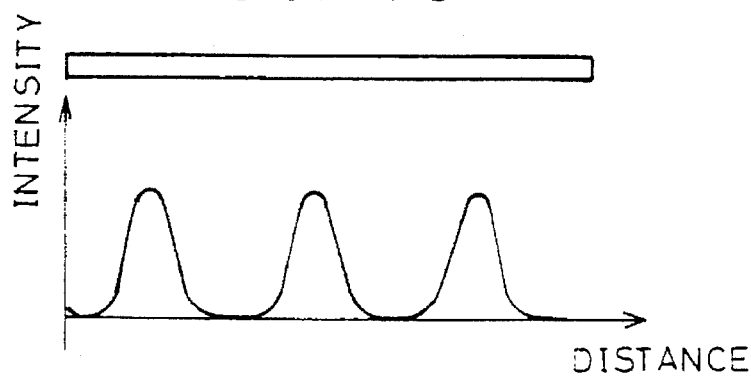
FIG. 4C is a graph showing the intensity property of a beam passing out of the top of the wafer.

Now, with reference to FIG. 4, there is shown the property of the PSM upon irradiation of a beam. While FIG. 4A shows the amplitudes of the beam which appears below the PSM, FIG. 4B shows the amplitudes of the beam which appear above the PSM. FIG. 4C is a graph showing the intensities of the beam, phase-shifted by the PSM, on a wafer. As apparent from the graphs suggested, it is possible to form shifter and screen only with resist patterns.

As mentioned above, when the screen 104-a and the shifter 102 are formed of the silver-doped inorganic resist and the organic polymer, Ge-Se, sharper screen profile and shift profile can be obtained.

This is based on the fact that not only does the silver-doped inorganic resist 104-a have strong reactive ion etch (RIE) resistance to oxygen ($O_2$), but also the selectivity between the silver-less inorganic resist 104-b and the silver-doped inorganic resist 104-a, i.e. Ge-Se:Ag/Ge-Se, is very high, for example, 500:1 for $SF_6$, 390:1 for $CF_4$, and about 20:1 for general alkali solutions. The strong RIE resistance and superior selectivity of the silver-doped inorganic resist can give a very significant advantage to the pattern formation procedure.

Figure 5:
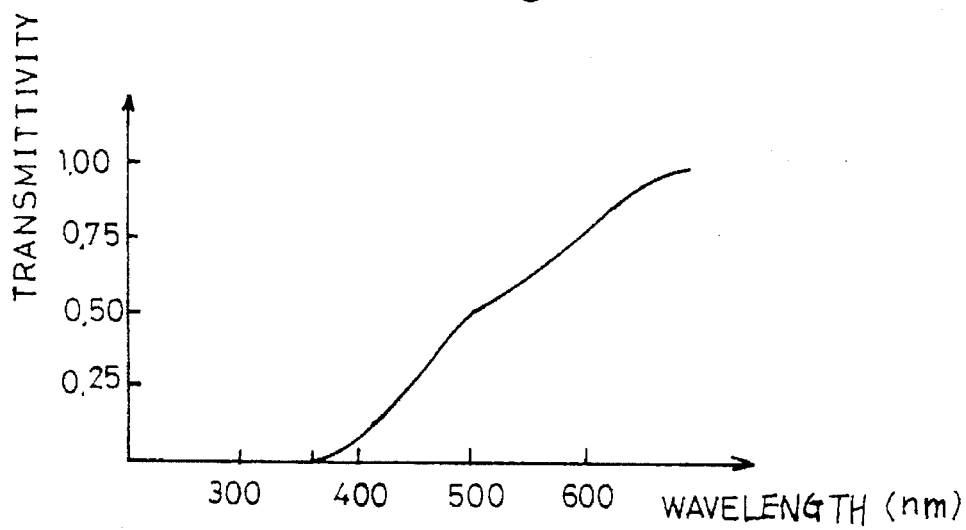
FIG. 5 is a graph showing the relation between transmittance of Ag/Ge-Se system of the present invention and the wavelength of a light source.

In addition, the silver-doped inorganic resist, Ag/Ge-Se, efficiently screens incident beams, leading to a more reduction of the transmittance. FIG. 5 shows the transmittances of the Ag/Ge-Se system with regard to beam wavelengths. As shown in this figure, the screening effect is increasingly improved as the wavelength goes below the i-line. This reflects that the method of the present invention can be advantageously applied to irradiation processes using short wavelengths.

Next, referring to FIG. 6, there is illustrated a method for accomplishing such PSM, according to a second embodiment of the present invention.

The steps shown in FIGS. 6A through 6G are carried out in the same way as those in FIGS. 3A through 3G.

Figure 6A:
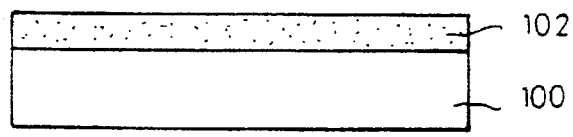
FIGS. 6A through 6H are schematic cross sectional views showing a method for fabricating a phase shift mask, according to a second embodiment of the present invention.
Figure 6B:
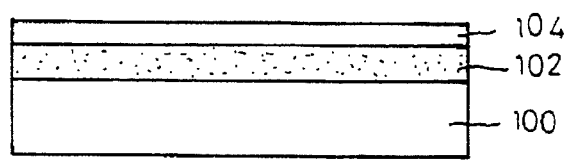
Figure 6C:
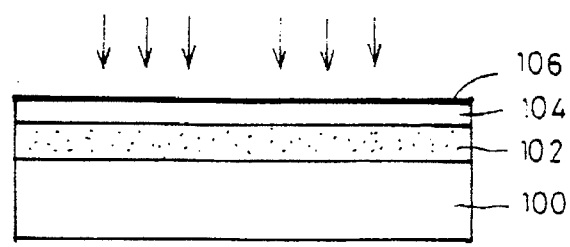
Figure 6D:
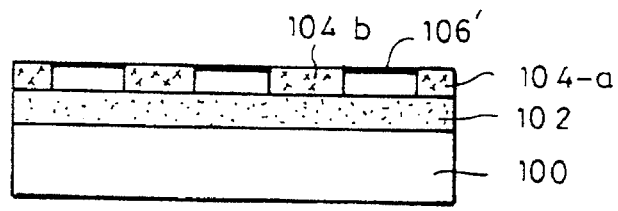
Figure 6E:
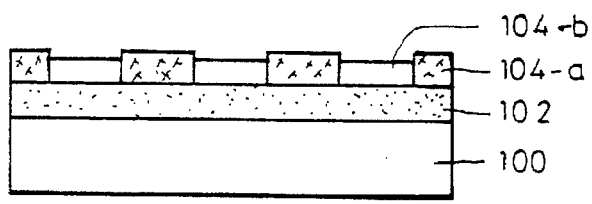
Figure 6F:
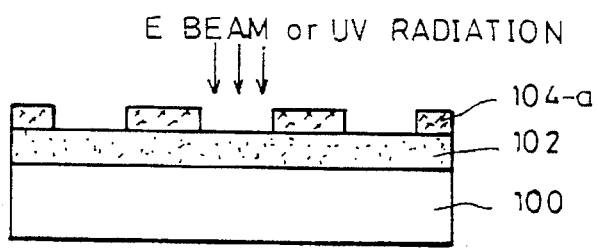
Figure 6G:
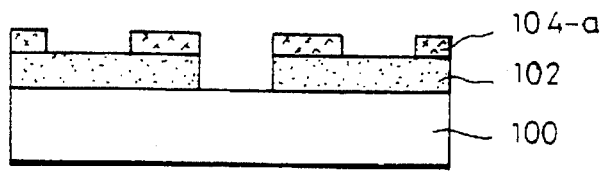
Figure 6H:
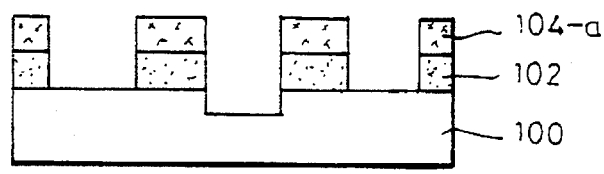

FIG. 6H is a cross section after the exposed surface of the substrate 100 is etched at a thickness T, represented by the formula $T=\lambda/2(n-1)$ wherein $\lambda$ and n are as defined above, while the organic polymer 102 serving as a mask, followed by selective etch of the organic polymer 102, PMMA, with utilizing the silver-doped inorganic resist 104-a as a mask.

Turning now to FIG. 7, there is illustrated a method for fabricating a PSM, according to a third embodiment of the present invention. In this embodiment, a selective oxygen reactive ion etch process is employed in order to form vertical side wall of the PMMA shifter or the like.

FIGS. 7A through 7E show the same process steps as those of FIGS. 3A through 3E.

Figure 7A:
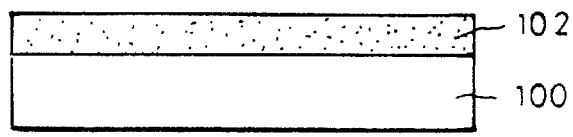
FIGS. 7A through 7H are schematic cross sectional views showing a method for fabricating a phase shift mask, according to a third embodiment of the present invention.
Figure 7B:
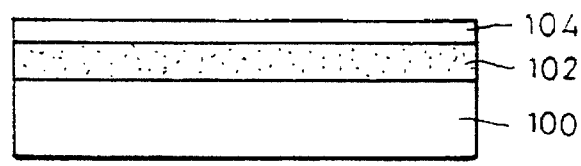
Figure 7C:
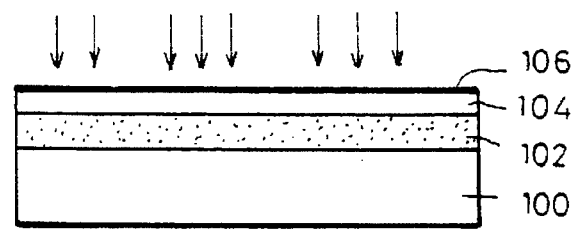
Figure 7D:
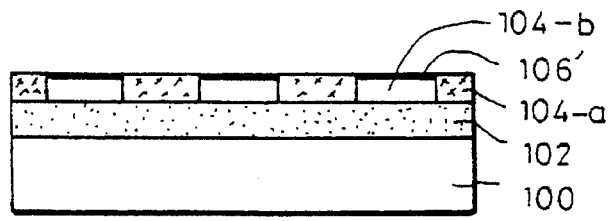
Figure 7E:
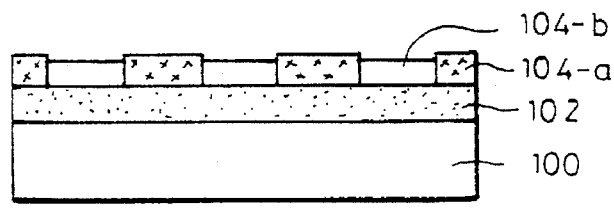
Figure 7F:
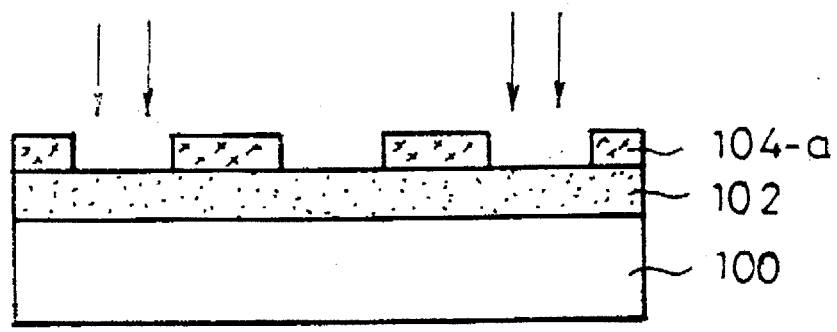

Thereafter, the organic polymer 102 on which the silver-doped inorganic resist pattern 104-a is formed is selectively exposed to light, as shown in FIG. 7F.

Figure 7G:
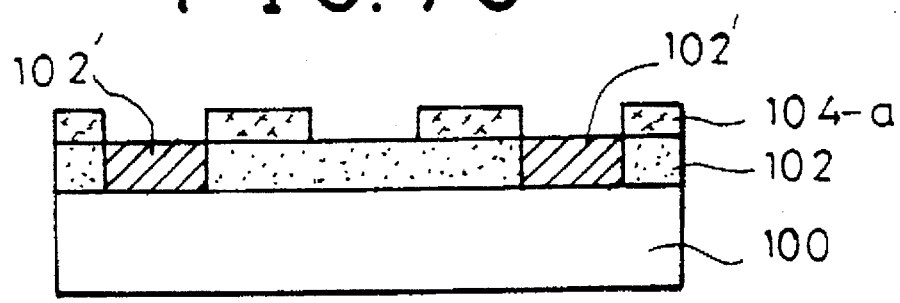

As a result, a latent image, represented by oblique lines, remains within the exposed organic polymer 102' as shown in FIG. 7G.

Figure 7H:
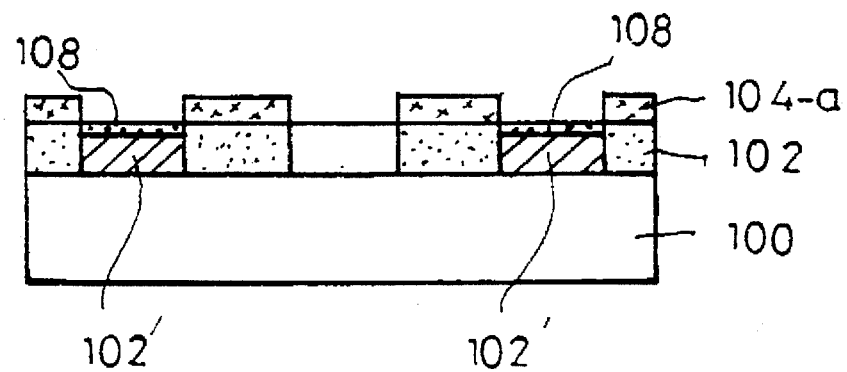

FIG. 7H is a cross section after hexamethyldisilazane is evaporated in vacuo to form a silylation layer on the exposed surface of the organic polymer 102', followed by dry etch. The dry etch is done in a reactive ion etch manner by use of oxygen plasma, allowing the silylation layer to be converted into an oxide film 108 while vertically removing only the unexposed organic polymer.

In order for the exposed organic polymer 102', PMMA, to play a role of shifter, the organic polymer 102 is formed at a thickness that follows the formula $T=\lambda/2(n-1)$ wherein T is the total thickness of the oxide film 108 and the exposed organic polymer 102', $\lambda$ is the wavelength of incident beam, and n is a refractive index of the shifter.

As described hereinbefore, the present invention offers several significant advantages along with methods for fabricating PSM. First, by virtue of using inorganic resist for screen, the method can be executed at low temperatures and a distortion of mask substrate can be prevented. Next, the vertical side wall of the shifter can be accomplished with ease owing to the high etch selectivity of the screen. In addition, the shifter beneath the screen offsets the bad affect resulting from the topology of the shifter, improving the effect of phase shift.

Other features, advantages and embodiments of the invention disclosed herein will be readily apparent to those exercising ordinary skill after reading the foregoing disclosures. In this regard, while specific embodiments of the invention have been described in considerable detail, variations and modifications of these embodiments can be effected without departing from the spirit and scope of the invention as described and claimed.

What is claimed is:

1. A method for fabricating a phase shift mask, comprising the steps of:
   forming a phase shifting film of polymethylmethacrylate and a screen on a transparent substrate, in sequence;
   forming an impurity layer on the screen;
   diffusing the impurities of the impurity layer selectively into the screen;
   removing the regions of the screen which are free of impurities; and
   selectively removing the phase shifting film.

2. A method in accordance with claim 1, wherein said screen is formed of germanium selenide $Ge_xSe_{1-x}$.

3. A method in accordance with claim 2, wherein the value of x ranges from 0.1 to 0.33.

4. A method in accordance with claim 2, wherein said screen of $Ge_xSe_{1-x}$ ranges in thickness from about 1,000 to 4,000 Angstrom.

5. A method in accordance with claim 1, wherein said impurities of said impurity layer are silver.

6. A method in accordance with claim 1, wherein said impurity layer is formed by treating the surface of the screen with an $AgNO_3$ aqueous solution.

7. A method in accordance with claim 1, wherein said impurity layer ranges in thickness from about 50 to 300 Angstrom.

8. A method in accordance with claim 1, wherein the step of selectively diffusing impurities into the screen includes the step of selectively exposing the impurity layer and the screen to light.

9. A method in accordance with claim 8, wherein regions of the impurity layer unexposed to the light are removed with an acid solution.

10. A method in accordance with claim 8, wherein unexposed regions of the impurity layer are removed with $HNO_3$-$HCl$-$H_2O$ solution.

11. A method in accordance with claim 1, wherein regions of the screen free of said impurities are removed with an alkaline solution.

12. A method in accordance with claim 1, wherein regions of the screen free of said impurities are removed with $(CH_3)_2NH$ aqueous solution.

13. A method in accordance with claim 1, wherein regions of the screen free of said impurities are removed by dry etch using one selected from the group consisting of $CF_4$, $CHF_3$ and $SF_6$.

14. A method in accordance with claim 1, wherein said phase shifting film has a thickness of $T=\lambda/2(n-1)$ where $\lambda$ is wavelength of a light from a source; and n is a refractive index.

15. A method in accordance with claim 1, wherein the screen doped with impurities comprises Ag/Ge-Se.

16. A method in accordance with claim 1, wherein said phase shifting film is removed by selectively irradiating E. beam or uv with the screen doped with impurities serving as a mask.

17. A method in accordance with claim 1, further comprising the steps of:
   etching an exposed surface of the substrate at a predetermined depth; and
   etching the phase shifting film using the screen diffused with impurities as a mask.

18. A method in accordance with claim 17, wherein said exposed surface of the substrate is etched at a depth of $\lambda/2(n-1)$ wherein $\lambda$ is wavelength of a light from a light source and n is a refractive index.

19. A method for fabricating a phase shift mask, comprising the steps of:
   forming a phase shifting film of polymethylmethacrylate, a screen and an impurity layer on a transparent substrate, in sequence;
   diffusing the impurities of the impurity layer selectively into the screen;
   selectively exposing the impurity layer and the screen to a light from a light source;
   removing the regions of the screen which are free of impurities;
   selectively forming silylation layers on the surface of the phase shifting film; and
   etching the phase shifting film with the silylation layers serving as a mask.

20. A method in accordance with claim 19, wherein said screen is formed of germanium selenide $Ge_xSe_{1-x}$.

21. A method in accordance with claim 20, wherein the value of x ranges from 0.1 to 0.33.

22. A method in accordance with claim 20, wherein said screen of $Ge_xSe_{1-x}$ ranges in thickness from about 1,000 to 4,000 Angstrom.

23. A method in accordance with claim 19, wherein said impurities of said impurity layer are silver.

24. A method in accordance with claim 19, wherein said impurity layer is formed by treating the surface of the screen with an $AgNO_3$ aqueous solution.

25. A method in accordance with claim 19, wherein said impurity layer ranges in thickness from about 50 to 300 Angstrom.

26. A method in accordance with claim 19, wherein regions of the impurity layer unexposed to the light are removed with an acid solution.

27. A method in accordance with claim 19, wherein regions of the impurity layer unexposed to the light are removed with $HNO_3$-$HCl$-$H_2O$ solution.

28. A method in accordance with claim 19, wherein regions of the screen free of impurities are removed with an alkaline solution.

29. A method in accordance with claim 19, wherein regions of the screen free of impurities are removed with $(CH_3)_2NH$ aqueous solution.

30. A method in accordance with claim 19, wherein regions of the screen free of impurities are removed by dry etch using one selected from the group consisting of $CF_4$, $CHF_3$ and $SF_6$.

31. A method in accordance with claim 19, wherein said phase shifting film has a thickness of $T=\lambda/2(n-1)$, where $\lambda$ is a wavelength of light from the light source; and n is a refractive index.

32. A method in accordance with claim 19, wherein the screen doped with impurities comprises Ag/Ge-Se.

33. A method in accordance with claim 19, wherein said silylation layer is formed by evaporating hexamethyldisilazane from the phase shifting film in a vacuum.

34. A method in accordance with claim 19, wherein said silylation layer is converted into an oxide layer by reactive ion etch using oxygen plasma when said phase shift film is etched.

* * * * *